(12) United States Patent
Azize et al.

(10) Patent No.: US 12,031,939 B2
(45) Date of Patent: Jul. 9, 2024

(54) METHOD OF MANUFACTURING A FIELD EFFECT TRANSDUCER

(71) Applicant: Analog Devices, Inc., Wilmington, MA (US)

(72) Inventors: Mohamed Azize, Medford, MA (US); Shekhar Bakshi, Portland, OR (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/827,619

(22) Filed: May 27, 2022

(65) Prior Publication Data

US 2022/0384604 A1 Dec. 1, 2022

Related U.S. Application Data

(60) Provisional application No. 63/195,104, filed on May 31, 2021.

(51) Int. Cl.
| | |
|---|---|
| *G01N 27/414* | (2006.01) |
| *G01N 27/30* | (2006.01) |
| *H01L 29/16* | (2006.01) |
| *H01L 29/423* | (2006.01) |

(Continued)

(52) U.S. Cl.
CPC ....... *G01N 27/4145* (2013.01); *G01N 27/301* (2013.01); *G01N 27/414* (2013.01); *H01L 29/42316* (2013.01); *H01L 29/66045* (2013.01); *H01L 29/66075* (2013.01); *H01L 29/1606* (2013.01); *H01L 29/4908* (2013.01)

(58) Field of Classification Search
None
See application file for complete search history.

(56) References Cited

U.S. PATENT DOCUMENTS

| | | | |
|---|---|---|---|
| 11,287,536 B1 * | 3/2022 | Howell | H01L 27/14659 |
| 2011/0163298 A1 * | 7/2011 | Sung | H01L 29/1606 |
| | | | 257/29 |

(Continued)

OTHER PUBLICATIONS

Pandey et al., *All CVD Boron Nitride Encapsulated Graphene FETIs with CMOS Compatible Metal Edge Contacts*, IEEE Transactions on Electron Devices, 65(10), 2018, 6 pages.

(Continued)

*Primary Examiner* — Khaja Ahmad
(74) *Attorney, Agent, or Firm* — ARENTFOX SCHIFF LLP

(57) ABSTRACT

Provided are methods of manufacturing comprising providing a FET base structure, the FET base structure comprising a substrate, a drain and a source; and providing a channel layer on the FET base structure; and providing a first layer on the FET base structure. The first layer comprises a one-dimensional or two-dimensional material and is arranged on an upper surface of the channel layer so as to form a sensing surface of the FET. The step of providing the channel layer comprises forming the channel layer and subsequently transferring the channel layer onto the FET base structure. Alternatively or additionally, the step of providing the first layer on the FET base structure comprises forming the first layer and subsequently transferring the first layer onto the FET base structure.

20 Claims, 5 Drawing Sheets

(51) Int. Cl.
*H01L 29/49* (2006.01)
*H01L 29/66* (2006.01)

(56) References Cited

U.S. PATENT DOCUMENTS

| | | | |
|---|---|---|---|
| 2013/0106443 A1* | 5/2013 | Jackson | G01N 33/5438 257/253 |
| 2013/0221346 A1* | 8/2013 | Lu | H01L 29/7869 257/43 |
| 2016/0056304 A1* | 2/2016 | Kim | B82Y 15/00 257/192 |
| 2016/0197148 A1* | 7/2016 | Shepard | H01L 29/42356 257/29 |
| 2017/0102357 A1* | 4/2017 | Liang | G01N 27/4145 |
| 2017/0160226 A1* | 6/2017 | Huang | G01N 27/4145 |
| 2018/0045717 A1* | 2/2018 | Shepard | H10K 85/225 |
| 2020/0196925 A1* | 6/2020 | Lin | A61B 5/14507 |

OTHER PUBLICATIONS

Shavanova et al.. *Application of 2D Non-Graphene Materials and 2D Oxide Nanostructures for Biosensing Technology*, www.mdpi.com/journal/sensors, 2016, 16, 223, 23 pages.

Dean et al., *Boron Nitride Substrates for High Quality Graphene Electronics*, Nature Nanotechnology, 5, 2010, 20 pages.

Meric et al., *Graphene Field-Effect Transistors Based on Boron Nitride Gate Dielectrics*, International Electron Devices Meeting, 2010, 4 pages.

Fu et al., *Graphene Transistors Are Insensitive to pH Change in Solution*, ACS Publications, © 2011 American Chemical Society, 4 pages.

Meric et al., *Graphene Field-Effect Transistors Based on Boron Nitride Gate Dielectrics*, © 2013 IEEE, Proceedings of the IEEE, vol. 101, No. 7, Jul. 2013, 11 pages.

Petrone et al., *Flexible Graphene Field-Effect Transistors Encapsulated in Hexagonal Boron Nitride*, ACS Nano, vol. 9, No. 9, 2015, 7 pages.

* cited by examiner

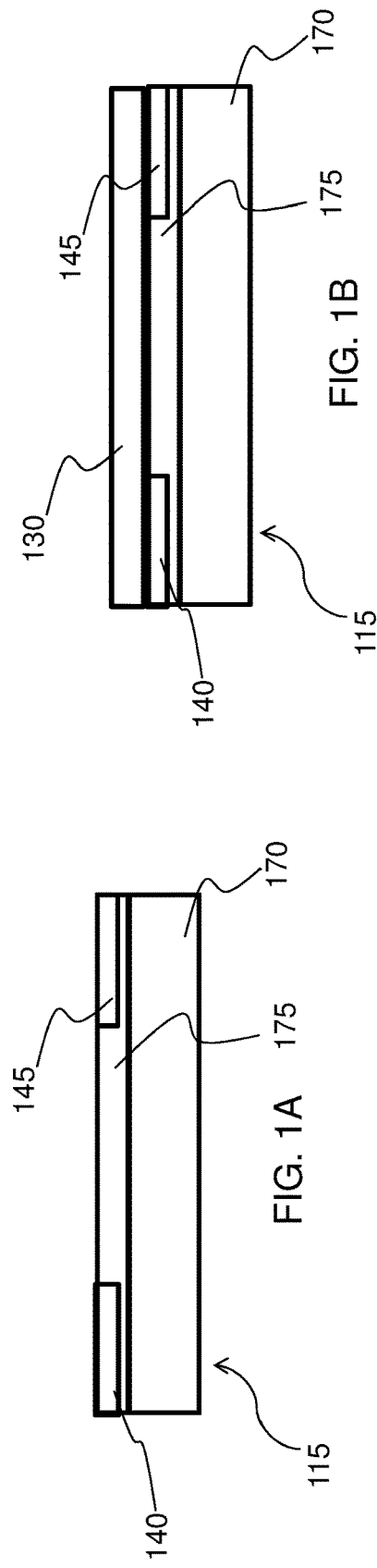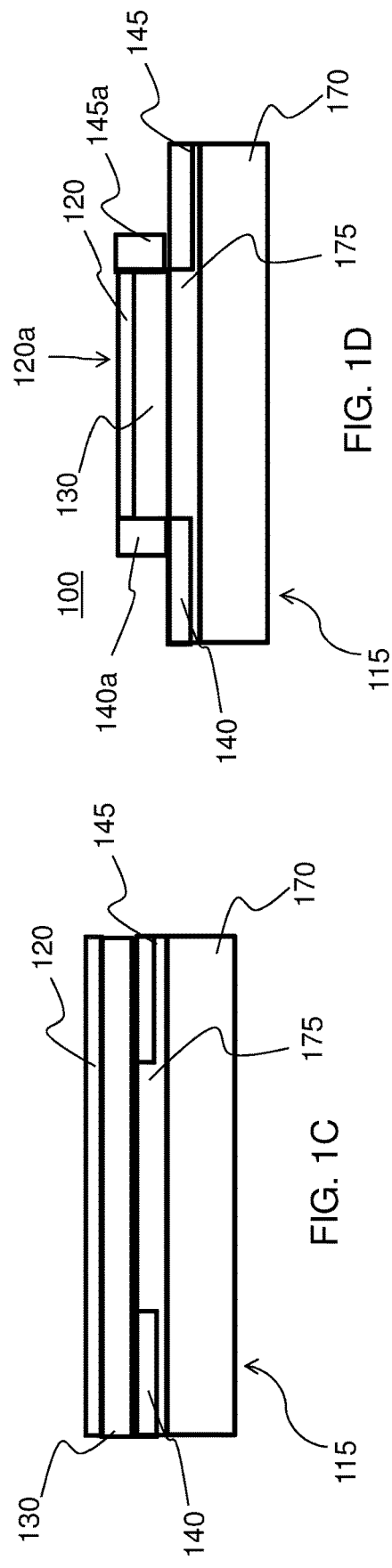

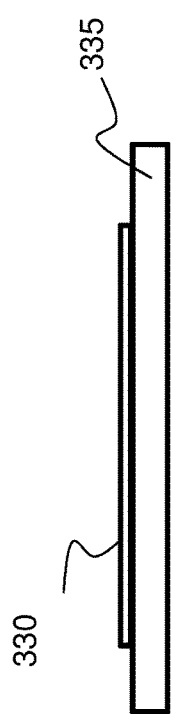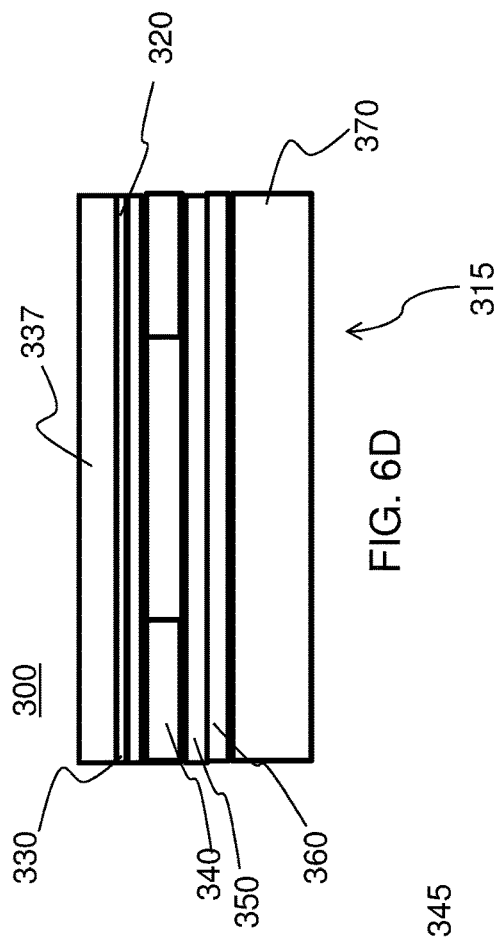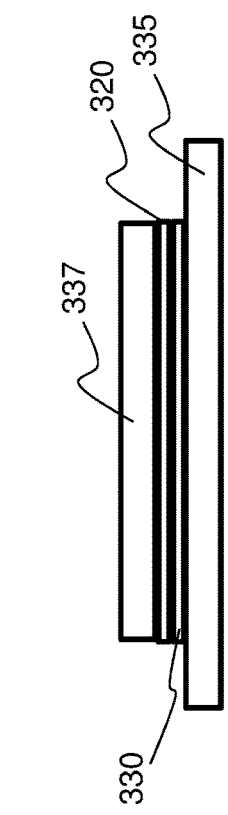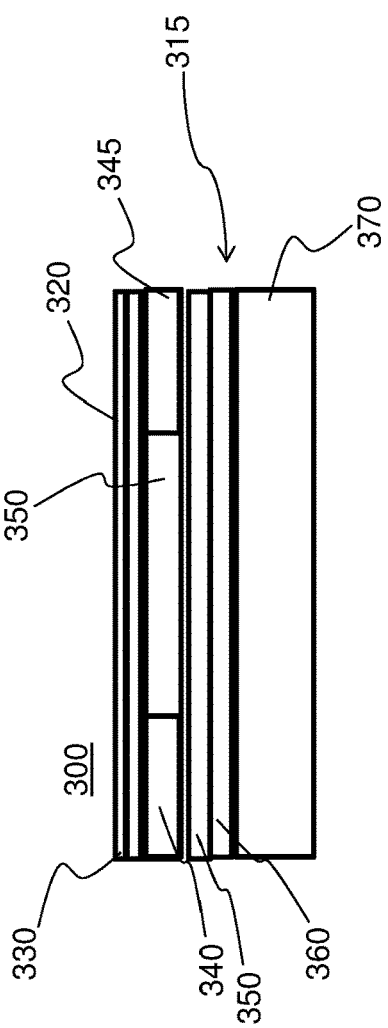

METHOD OF MANUFACTURING A FIELD EFFECT TRANSDUCER

PRIORITY APPLICATION

This patent application receives benefit from and claims priority to U.S. Provisional Application Ser. No. 63/195,104, filed on May 31, 2021, titled "2D MATERIAL-BASED FET SENSORS CMOS COMPATIBLE PROCESS". The US Provisional Application is incorporated by reference in its entirety.

BACKGROUND

Various sensing assemblies are known for determining properties of a sample. For example, sensors can be used to detect the presence of particular analytes or take measurements such as conductivity or pH. These are useful in the fields of biosensors, where particular analytes within or particular parameters of a bodily fluid are measured.

One particular type of sensing assembly uses a field effect transistor (FET). FETs include a channel, the electrical conductivity of which is modified by a gate. This property of the channel is measured by applying a voltage between a source and drain in communication with the channel. The properties of the sample passing over the FET impact the electrical conductivity of this channel by changing the electrostatic potential at the surface of the FET (acting as a gate). For example, in the case of biosensors, there may be a functional layer provided on the FET which interacts a specific analyte. Binding of this analyte modifies the electrostatic potential at the surface, modifying the channel properties. However, FETs improvements are required to provide precise and sensitive FETs.

While some improvements have been made, manufacturability of the new FET designs is a key consideration. Techniques for providing new or modifying existing FET structures are onerous and do not lend themselves to mass production. For example, some FET designs are not compatible with semiconductor (CMOS) fabrication techniques. This limits device yield and also in turn limits the miniaturisation of these FETs. One type of FET which shows potential for providing useful sensing capabilities are graphene-based FETs ("GFETs"). These are FETS where the channel is graphene. These show high sensitivity and therefore enable low limits of detection. However, GFETs, typically use a monolayer of graphene as the channel, which leads to difficulties with manufacturing and scale up. It is also difficult to functionalise the surface or build up subsequent layers due to thin graphene layer and difficulties with surface chemistry of graphene and the incorporation of this into existing large-scale manufacturing processes. Moreover, generally, improved designs of GFETS are required.

Therefore, improved methods of manufacturing improved FET structures for sensing assemblies are required.

SUMMARY OF THE DISCLOSURE

Provided are methods of manufacturing comprising providing a FET base structure, the FET base structure comprising a substrate, a drain and a source; and providing a channel layer on the FET base structure; and providing a first layer on the FET base structure. The first layer comprises a one-dimensional or two-dimensional material and is arranged on an upper surface of the channel layer so as to form a sensing surface of the FET. The step of providing the channel layer comprises forming the channel layer and subsequently transferring the channel layer onto the FET base structure. Alternatively or additionally, the step of providing the first layer on the FET base structure comprises forming the first layer and subsequently transferring the first layer onto the FET base structure.

In one embodiment, a method of manufacturing a field effect transducer (FET), the method comprises:
 providing a FET base structure, the FET base structure comprising a substrate, a drain and a source; and
 providing a channel layer on the FET base structure; and
 providing a first layer on the FET base structure,
 wherein the first layer comprises a one-dimensional or two-dimensional material and is arranged on an upper surface of the channel layer so as to form a sensing surface of the FET; and
 wherein at least one of:
  the step of providing the channel layer comprises forming the channel layer and subsequently transferring the channel layer onto the FET base structure; and/or
  the step of providing the first layer on the FET base structure comprises forming the first layer and subsequently transferring the first layer onto the FET base structure.

BRIEF DESCRIPTION OF THE DRAWINGS

The present invention will now be described in more detail with reference to the accompanying drawings, which are not intended to be limiting:

FIGS. 1A to 1D provides schematic cross-sectional views of the components during a method of manufacture according to an embodiment;

FIGS. 6A to 4E provides schematic cross-sectional views of the components during a method of manufacture according to an embodiment.

DETAILED DESCRIPTION

Figure 3:
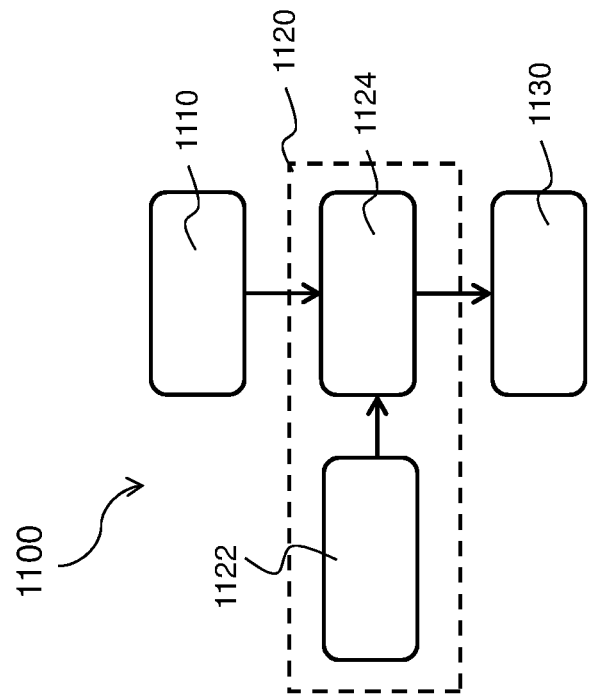
FIG. 3 provides a schematic depiction of a method according to an embodiment.

Various sensing assemblies are known for determining properties of a sample. For example, sensors can be used to detect the presence of particular analytes or take measurements such as conductivity or pH. These are useful in the fields of biosensors, where particular analytes within or particular parameters of a bodily fluid are measured. One particular type of sensing assembly uses a field effect transistor (FET). FETs include a channel, the electrical conductivity of which is modified by a gate. This property of the channel is measured by applying a voltage between a source and drain in communication with the channel. The properties of the sample passing over the FET impact the electrical conductivity of this channel by changing the electrostatic potential at the surface of the FET (acting as a gate). For example, in the case of biosensors, there may be a functional layer provided on the FET which interacts a specific analyte. Binding of this analyte modifies the electrostatic potential at the surface, modifying the channel properties.

As discussed above, improved FET designs are needed to provide improved sensing capabilities. However, there is a need for improvements in manufacturing FETs so that these can be miniaturised and manufactured on larger scales while maintaining these improved sensing capabilities. Many techniques for providing FET structures are onerous and required complex techniques which are susceptible to failure and do not lend themselves to mass production. One type of FET which shows potential for providing useful sensing capabilities are graphene-based FETs ("GFETs"). These are FETS where the channel is graphene. These show high sensitivity and therefore enable low limits of detection. However, GFETs, typically use a monolayer of graphene as the channel, which leads to difficulties with manufacturing and scale up.

Manufacture also needs to allow for addition of sensitive layers, such as functional layers.

Therefore, improved methods of manufacturing improved FET structures for sensing assemblies are required.

In one embodiment, a method of manufacturing a field effect transducer (FET), the method comprises:
providing a FET base structure, the FET base structure comprising a substrate, a drain and a source; and
providing a channel layer on the FET base structure; and
providing a first layer on the FET base structure,
wherein the first layer comprises a one-dimensional or two-dimensional material and is arranged on an upper surface of the channel layer so as to form a sensing surface of the FET; and
wherein at least one of:
the step of providing the channel layer comprises forming the channel layer and subsequently transferring the channel layer onto the FET base structure; and/or
the step of providing the first layer on the FET base structure comprises forming the first layer and subsequently transferring the first layer onto the FET base structure.

Embodiments of such methods can be used to enables the production of improved FETs and, importantly, enables the integration of the production of these FETs into existing methods for manufacturing electronic devices, such as semiconductor manufacturing on Si or polymeric wafers (substrates). This is achieved by manufacturing the base components of the FET (herein the "base structure") in one process which can be e.g. using a semiconductor (CMOS) processing, and subsequently providing the materials which provide the improved FET functionality (i.e. the first layer and, in some embodiments, the channel) but which do not necessarily lend themselves to mass/semiconductor processing or which are at risk of damage at the end of the process. This provides efficiency during the FET base structure processing but also protects the materials (e.g. one or two-dimensional materials) by avoiding exposing them to the processing techniques used to form the FET base structure, which often requires higher temperatures and exposure to harsh chemicals (e.g. etchants). Moreover, integration of a first layer into the device can also be carried out using traditional fabrication processes. For example, microfabrication using photolithography is possible without the need for manual assembly of discrete components, e.g. in the FET base structure.

In the method, the FET base structure is formed in one step and (i) the channel layer is formed separately to (i.e. not formed on) the FET base structure and is then transferred as a channel layer onto the FET base structure (i.e. to provide the channel of the FET); and/or (ii) the first layer is formed separately to the FET base structure and is then transferred as a formed first layer onto the FET base structure. In some embodiments, both may occur such that both the channel layer and the first layer are formed and then subsequently transferred onto the FET base layer. It will be appreciated that the order formation of each of the layers and the FET base structure is not limited and that they may be formed in any order, provided that the first layer and the channel layer are transferred onto the FET base structure after the FET base structure is formed. That is, the method may comprise providing the channel layer and/or first layer prior to providing the FET base structure, and then assembling the components together.

Accordingly, the method set out herein provides a FET, which can form a part of a sensing assembly for detecting a property of a sample, the FET comprising a first layer providing a sensing surface; a channel provided below the first layer; a drain in electrical communication with the channel; and a source in electrical communication with the channel, wherein the first layer comprises a one-dimensional or two-dimensional material. Such a FET provides an improved means of detecting a property of a sample, such as the presence of an analyte or a parameter.

In particular, the presence of the first layer in this way enables accurate sensing of the property while also making the FET more robust and less prone to drift. Specifically, the presence of these materials is particularly advantageous as they protect the FET from surface effects and contamination while also increasing sensitivity, or at the least without negatively impacting the performance of the sensor. In particular, the one- or two-dimensional material acts as a protective layer for the channel but does not sacrificing the performance of the channel due to the sensitivity of these surfaces. The materials can be provided at nano-layer thickness by using only a one or a few layers thick of the materials. Detrimental effects, such as liquid surface effects and contamination are particularly prominent in GFETs (due to the very thin graphene layer channel) and the presence of the first layer with one- or two-dimensional materials enables the use of these in environments which would otherwise prevent their use, such as particular biosensing applications. This also allows them to be used more reliably for measurements which are otherwise prone to unreliable measurements, such as pH measurements. The method thus enables the provision of an improved FET by enabling this to be formed on a larger scale and using existing processing techniques which permit miniaturisation of the base components.

Additionally, the thicknesses and chemistry of the one and two-materials means that they can act as an effective passivation layer for the sensors. The layers, including those containing graphene-like structures, can be doped or modification to provide further functionality. The one and two-dimensional materials can also be much easier to functionalisation than existing FET materials. For example, these can often be easier to functionalise than the channel materials due to the material properties and/or due to the fact that the channels are prone to damage in manufacturing processes. Hexagonal boron nitride (hBN), for example, lends itself to functionalisation and capture species can be covalently bonded to its surface. The presence of this first layer can therefore increase device yield from the manufacturing process and the robustness of the ultimate device. Moreover, the methods disclosed herein enable this to be carried out separately to and without exposure of functionalised and/or doped surfaces to the processing conditions required for providing the remainder of the device.

It will be appreciated that the steps of providing further layers on the FET base structure and on other layers, including e.g. the first layer on the FET base structure, does not require these layers to be provided directly on the other entity. That is, this may be indirectly on, for example as there may be intervening or intermediate layers. For example, providing the first layer on the FET base structure may comprise providing the first layer on top of another layer (e.g. the channel layer) which itself is provided (directly or indirectly) on the FET base structure.

Moreover, it will be appreciated that providing a layer on the FET base structure or another layer may requires that the layer in question is provided over (on top of) at least a part of the other entity, but need not be provided over all of the other entity or cover all of the entity. For example, it may be that a channel layer is provided onto the FET base structure such that it is on top of a substrate but it may be located between the source and drain. The first layer may be provided on top of at least a part of the channel layer or it may be provided over all of the channel layer. Moreover, there may be intermediate layers present. That is "providing" a layer "on" another component can comprise directly on or indirectly on. For example, providing the first layer on the FET base structure can comprise providing the first layer on the channel layer, which itself is provided on the FET base structure. In some embodiments, the channel layer is provided directly on the FET base structure. In other embodiments, the channel layer is provided directly on a second layer, which second layer is provided on the FET base structure (directly on or indirectly on).

First Layer and Channel Layer

In one embodiment, the method comprises forming the first layer and subsequently transferring the first layer onto the FET base structure. That is, the method in one embodiment includes forming the first layer and subsequently assembling the first layer on the FET base structure after formation of the first layer (and after formation of the FET base structure). As discussed above, as the first layer comprises 1D/2D materials, it is advantageous to provide these after the formation of the FET base structure since this allows the FET structure to be produced using well-optimised methods and because this reduces the risk of damage to the first layer.

The first layer may be provided directly on the channel layer (i.e. channel). That is, in some embodiments, the first layer may be provided in direct contact with the channel. In other embodiments, there may be an intermediate layer or intermediate layer(s) between the first layer and the channel.

The step of providing the first layer on the FET base structure includes providing the first layer on the channel layer. Providing the first layer on the channel layer may be carried out before or after the channel layer is provided on the FET base structure. For example, this step may comprise first providing the first layer onto the channel layer and subsequently providing the channel layer and first layer onto the FET base structure. Alternatively, the channel layer may be provided on the FET base structure and subsequently the first layer may be provided on the channel layer while the channel layer is on the FET base structure. Providing the first layer on the channel layer may comprise forming the first layer on the (previously formed) channel layer, joining the first layer and channel layer after each has been formed, forming the channel layer on the (previously formed) first layer, or simultaneously forming both the first layer and channel layer together.

In one embodiment, the steps of forming the channel layer and subsequently transferring the channel layer onto the FET base structure and providing the first layer on the FET base structure comprise:
  forming the channel layer;
  subsequently providing the first layer on the channel layer; and
  subsequently transferring the channel layer and the first layer onto the FET base structure.

In this way, the transfer of the first layer and channel layer are carried out simultaneously. That is, the method comprises transferring the channel layer and first layer (simultaneously) onto the FET base substrate. Forming the first layer and channel layer and subsequently providing them together has advantages of reducing the number of transfer steps and the handling of the channel and first layer, both of which can be prone to damage and contamination, which in turn lead to reduced mobility within the channel (and thus sensitivity) and a higher likelihood of failure. For example, as the first layer comprises and can be formed of one- or two-dimensional materials, which can provide a first layer thin as <1 nm (e.g. 0.34 nm), and similarly some channels such as graphene channels are equally as thin (e.g. a monolayer of graphene), the components at risk of damage can be prepared separately and subsequently combined with the FET base structure after the other processing steps have been carried out. Moreover, formation of these layers can be the most complex part of FET manufacture. Reducing the involvement of these layers in the FET manufacturing process (i.e. by not having them on the base until base the base is fully formed) reduces risk of damage. Moreover, these surfaces are often the subject of functionalisation and this process allows for this to be carried out in a different environment and only included once the remainder of the FET has been constructed (or at least some of the processing steps are complete). This reduces damage to sensitive functional layers.

In this embodiment, the first layer and channel layer can be provided to an upper surface of the FET base structure, and will be configured so that the first layer forms the sensing surface. This may result in a structure of FET base structure/channel/first layer through a cross section.

Alternatively, in some embodiments, the first layer can be provided to or formed on the channel layer after the channel layer has been provided on the FET base structure. This may be advantageous in embodiments where the channel can be formed using the same processing techniques as the FET base structure (e.g. semiconductor processing, such as conversion of Si to poly-Si (e.g. W/poly-Si)).

Forming the First Layer and Channel Layer

In one embodiment, providing the first layer on the channel layer comprises forming the first layer on the channel layer. This can be on one surface of the channel layer (either prior to assembly of the channel layer on the FET base structure or after assembly of the channel on the FET base structure). In other words, the layer is formed in situ on the channel layer. This can, for example, mean the channel acts a substrate for growth. Channel materials provide useful substrates for formation of one- and two-dimensional materials since they provide a thin, and provide an essentially pristine and flat surface for the formation of these materials. One particularly effective combination is in the case of GFETs as graphene can provide an excellent substrate for the formation of one and two dimensional materials.

One particularly effective first layer material for forming on the surface of the channel is hexagonal boron nitride (hBN). This provides a particularly effective first layer, as set out in more detail below. Moreover, in terms of manufacturability, unlike many materials, it is easy to provide hBN on flat 2D surfaces such as those of a channel. This can be particularly beneficial for GFETS as graphene surfaces (i.e. on the channel) does not comprise defects or 3D growth starting areas and because of the very similar lattice structures and lack of dangling bonds on the graphene surface. The formation of some other materials on graphene requires formation of these, followed by flattening of the layer. The use of hBN in turn enables integration of this into more traditional CMOS fabrication methods. For example, this will allow an easier low cost monolithic integration of the sensing layers (channel layer and first layer) on the top of finished CMOS Si electronics wafers or plastic wafers. As such, in one embodiment, the channel layer comprises graphene and the first layer comprises hexagonal boron nitride (hBN), and forming the first layer on the channel layer comprises forming hBN on the graphene surface.

In one embodiment, providing the first layer on the channel layer comprises forming the first layer on the channel layer. This can be as a part of forming the first layer on the first channel prior to providing the first layer on the channel layer; and subsequently transferring the channel layer and the first layer onto the FET base structure. This is advantageous as the entire FET structure need not be exposed to the forming conditions, which can for example require immersion of the substrate or may provide a bottleneck in the manufacturing process. Where non-standard semiconductor processing techniques are required, this can separate the processes and enable all semiconductor processing techniques to be undertaken forming a finished wafer followed by the finishing of the FET by addition of the other components (i.e. the channel and the first layer).

Alternatively, the first layer can be formed on the channel after the channel has been provided on the FET base structure.

The one- or two-dimensional materials can be formed using known methods in the art. For example, graphene and hBN can be formed using epitaxy (e.g. chemical vapour deposition). One advantageous combination is the growth of a first layer of hBN on a graphene substrate, where the graphene substrate forms the channel layer.

In one embodiment, the first layer comprises hBN. The arrangement of the hBN layer and how the hBN is produced can influence its properties. For example, because of the heterogeneous nature of the six-membered ring, the direction of growth of the layers of hBN can influence the properties. This can result in different terminating edges (referred to as zig-zag or armchair edges). For example, in a similar manner to N-polar or Ga-Polar GaN, the different structures of hBN can be deemed to be N-polar or B-polar. N-polar and B-polar hBN have different surface properties, such as surface energies. hBN as referred to herein incorporates both N-polar and B-polar hBN. By referring to the first layer comprising N-polar hBN, this refers to the upper surface of the first layer comprising or consisting of N-polar hBN. That is, in the case of the first layer which defines the sensing surface, the outwardly facing surface of the layer relative to the remainder of the FET. In such arrangements, the face terminates in N atoms. The opposite is true for B-polar hBN (i.e. the face terminates in B atoms). In some embodiments, the first layer may comprise an N-polar outer hBN layer. That is, if the first layer comprises or consists of a single layer, the single layer is N-polar hBN, or where the first layer comprises or consists of plural layers, the layer furthest from the channel is N-polar hBN. N-polar hBN has been found to provide favourable properties due to the particular chemistry of the surface reducing the risk of undesirable interactions caused by liquid samples. This is due to electronic properties of the surface, at least in part caused by the electronegativity of N compared to B. Moreover oxidising and functionalisation are easier. Alternatively, the first layer may comprise a B-polar outer hBN layer. In some embodiments, where a second layer is present, the second layer may comprise N-polar hBN. This may be the hBN layer of the second layer closest to the channel, where plural layers of hBN are present in the second layer. Reference to the polarity in the context of the second layer refers to the upper surface of the second layer (i.e. the surface in contact with or facing the channel).

In some embodiments, providing a first or second layer comprising N-polar hBN can comprise by forming hBN on a temporary substrate (e.g. via the typical routes such as CVD), which typically results in formation of B-polar hBN, and flipping the hBN sheet so as to expose the N-polar surface. For example, the method of manufacture may comprise forming hBN on a surface (e.g. a temporary substrate), transferring the hBN onto the channel by contacting the exposed surface of the hBN and removing the temporary substrate. In this way, the surface of hBN that was previously in contact with the the temporary substrate is now the upper/exposed surface. This provides the N-polar surface as the exposed hBN surface.

Transfer

For the first layer, channel layer and, where present, the second layer, each can be formed prior to assembling the respective layer on top of the FET base layer. However, since the first layer and, where present, second layer comprise or are formed from one dimensional or two dimensional materials (and often thin layers of these materials), it can be advantageous to support these during the process of transferring them onto the FET base layer. Similar considerations can apply to the FET channel layer, for example where this comprises or is formed from graphene, such as in a GFET. For each of the respective layers, the method may therefore comprise supporting the respective layer on a supporting body (or a "support") during the process of transferring the respective layer onto the FET. This protects the layer and also improves the ease of transfer. For example, in one embodiment, during the step of transferring the channel layer onto the FET base structure, the channel layer is supported on a supporting body, and wherein the method further comprises separating the supporting body from the channel layer. This separation may be after the channel layer has been provided on the FET base structure. Similarly, in one embodiment, where the first layer is formed and subsequently transferred onto the FET structure, the first layer is supported on a supporting body, and wherein the method further comprises separating the supporting body from the first layer. This separation may be after the first layer has been provided on the FET base structure. The same is also possible for the second layer. Transfer methods of these types are particularly useful for the transfer of one- and two-dimensional materials as these protect the integrity of the layer and facilitate handling, and can be configured so as to not damage the layers.

In some embodiments, the supporting body or support may be a temporary substrate on which the respective layer (first layer, channel layer or, where present, second layer) was formed. In other embodiments, the respective layer is first formed on a temporary substrate before transfer on to the supporting body and subsequent transfer onto the FET base structure. For example, in one embodiment, the step of forming the channel layer comprises forming the channel layer on a temporary substrate and subsequently transferring the channel layer from the temporary substrate to a supporting body. In other embodiments, alternatively or additionally, the same process may be used for the first layer and/or the second layer (where present). By "temporary substrate", it means a substrate which the respective layer(s) is only used for a part of the process. Although such a method introduces an additional transfer step, this is advantageous for the formation of e.g. one- and two-dimensional materials as formation can be optimised. In particular, the substrate on which these are formed may not be the optimal substrate for transfer and the temporary substrate and/or the method of removing the material from the temporary may not be suitable for incorporation into a large-scale manufacturing process (i.e. it may be preferable to separate this part of the process from the step of integrating these layers with the FET base structure). In one embodiment, the respective layer(s) is/are formed on a temporary substrate in the form of a foil (e.g. a copper foil), and is subsequently transferred onto a polymeric support (e.g. polymethyl methacrylate (PMMA)). For example, this may be achieved by forming the respective layer(s) by CVD on the foil, followed by spin-coating the polymeric support onto the exposed side of the formed layer(s). The foil can then be removed, e.g. by etching, leaving the polymeric support and layer. The polymeric support and layer(s) can be provided on the FET base structure before the polymeric layer is removed. Exemplary methods of production and transfer of graphene, which can be used as the channel and/or as a material in the first and second layer, are set out in "Continuous Growth of Highly Reproducible Single-Layer Graphene Deposition on Cu Foil by Indigenously Developed LPCVD" Setup Kashyap, ACS Omega 2019 4 (2), 2893-2901, which is incorporated herein by reference. This is an example of a wet transfer method. It will be appreciated, however, that the steps of transferring the respective layer(s) onto to the supporting body and separating the respective layer(s) from the substrate can be carried out in any order. In some embodiments, a dry transfer method is used. Such a method does not require the support and layer(s) to be submerged in a liquid or solution in order to remove the support.

In some embodiments, the layers may be combined onto a single temporary substrate or support so that only a single transfer step is needed. This further separates the more difficult processing techniques from the larger scale processing techniques and reduces the number of assembly steps at the end of the process. Further, in one embodiment, during the step of transferring the channel layer and the first layer onto the FET base structure, the channel layer and first layer are supported on a supporting body; and wherein the method further comprises separating the supporting body from the channel layer and first layer. This may be after the channel layer and first layer have been provided on the FET base structure so that the channel layer is supported at all times. In one embodiment in which both a temporary substrate and supporting body are used, providing the first layer on the channel layer comprises providing the first layer on the channel layer while the channel layer is on the temporary substrate. Where a second layer is present, the method may further comprise supporting the second layer on the supporting body, and separating the second layer from the supporting body. This may be in addition to or an alternative to the first layer being provided on the channel.

In some embodiments, as set out herein, at least one of the layers may be formed on another other such that the other acts as a substrate for the formation. For example, the first layer and/or second layer, where present, may be formed on the channel layer. The channel layer may be formed on the first and/or second layer, where present. In embodiments where a temporary substrate and/or support body is used, the layers may be formed on a temporary substrate or supporting body with another layer already formed thereon. In one embodiment, forming the first layer on the channel layer comprises: forming the channel layer on a substrate; forming the first layer on the channel layer and substrate (e.g. on a surface of the channel layer whilst the channel layer is on the substrate); and transferring the channel layer and first layer to a supporting body and separating the channel layer from the substrate. For example, in some embodiments, the transfer onto the supporting body is carried out before the removal of the substrate so that the channel layer and first layer are supported at all times. These methods can improve the efficiency and ease of manufacture, since the layers are formed in situ on each other and on a substrate. It will be appreciated that this can, in some embodiments, incorporate the further step of transfer from a temporary substrate (e.g. for the forming process of the layer(s)) to a supporting body, for subsequent transfer to the FET base structure.

Second Layer

In some embodiments, the method further comprises providing a second layer on the FET base structure, the second layer comprising a one-dimensional or two-dimensional material, wherein the second layer is arranged on the lower surface of the channel layer. In some embodiments, the step of providing the second layer comprises forming the second layer and subsequently transferring the second layer onto the FET base structure.

Provision of a second layer below the channel (i.e. an additional layer comprising a one-dimensional or two-dimensional material is provided on the opposite side of the channel layer to the first layer) can be used to further constrain charge carrier movement to the channel formed by the channel layer. Thus, the first layer is provided on the upper major surface and the second layer is provided on the lower major surface. The one-dimensional or two-dimensional material can, in embodiments, be the same material as the first layer or can, in other embodiments, be a different one-dimensional or two-dimensional material. The one-dimensional or two-dimensional material of the second layer can be any of the materials set out in respect of the first layer.

The second layer may be provided directly beneath the channel layer (i.e. the channel of the FET). That is, in some embodiments, the second layer may be provided in direct contact with the channel. In other embodiments, there may be an intermediate layer or intermediate layer(s) between the second layer and the channel. Relative to the other layers, the second channel can be provided between the gate and the channel (that is, it is provided above the gate and below the channel).

As noted above, in some embodiments, the steps of forming the channel layer and transferring the channel layer onto the FET base structure and providing the second layer comprise:
  forming the channel layer;
  subsequently providing the second layer on the channel layer; and
  subsequently transferring the channel layer and the second layer onto the FET base structure.

The step of providing the channel layer on the second layer may be carried out before or after the second layer is provided on the FET base structure. For example, this step may comprise first providing the channel layer onto the second layer and subsequently providing the channel layer and first layer onto the FET base structure. Alternatively, the channel layer may be provided on the FET base structure and subsequently the first layer may be provided on the channel layer while the channel layer is on the FET base structure. Providing the channel layer on the second layer may comprise forming the channel layer on the (previously formed) second layer, joining the second layer and channel layer after each has been formed separately, forming the second layer on the (previously formed) channel layer, or simultaneously forming both the channel layer and channel layer together. Where the first layer is also provided on the channel layer in this way, this may be formed separately or at the same time to the other second layer and channel layer.

In one embodiment, the step of providing the second layer on the channel layer comprises forming the second layer on the channel layer. Embodiments for forming the first layer on the channel layer apply equally to forming the second layer on the channel. Similarly, a particularly advantageous improved method comprises forming a second layer comprising hBN on the surface of the channel layer. As noted above, unlike many materials, it is easy to provide hBN on flat 2D surfaces such as those of a channel. This can be particularly beneficial for GFETS as graphene surfaces (i.e. on the channel) does not comprise defects or 3D growth starting areas.

In one embodiment, the steps of forming the channel layer and transferring the channel layer onto the FET base structure, providing the first layer and providing the second layer comprise: forming the channel layer; subsequently providing the first layer and second layers on the channel layer; and subsequently transferring the channel layer, the first layer and the second layer onto the FET base structure. In a further embodiment, the step of providing the first layer and second layer on the channel layer comprises forming the first layer and second layer on the channel layer. This enables the nano-material processing to be integrated into the manufacturing in a single step, reducing transfer steps and reducing handling.

FET Structure

The method includes providing a FET base structure, the FET base structure comprising a substrate, a drain and a source. The FET base structure is accordingly provided as a single (e.g. unitary) component to which the channel layer and first layer can be provided to form the complete FET. The FET base structure may, for example, be a semiconductor structure (e.g. a monolith) and may further include additional elements. The first layer is arranged on an upper surface of the channel layer so as to form a sensing surface of the FET. Arranged refers to the final FET structure, with the upper surface being relative to the remainder of the FET where the FET base structure forms a base, with the channel layer above at least part of the FET base structure and the first layer above at least part of the channel layer.

In one embodiment, the FET base structure further comprises a gate comprising a gate electrode (e.g. as a gate electrode layer) and a gate dielectric (e.g. a gate dielectric layer). The first layer can be arranged on the FET base structure above the gate. Thus, the method further comprises providing the gate electrode on the substrate and providing the gate dielectric layer on the substrate. The gate dielectric layer is located between the gate electrode and the source, drain and channel. This further uses the efficiencies of manufacture, such as large-scale semiconductor processing, to provide the base components of the FET on a single wafer or chip before incorporating the more complex parts. From a structural perspective, issues with surface effects are also mitigated by this FET structure which has particular benefits in sensors. In particular, the first layer sits between the bottom gate (e.g. a gate dielectric) and the sensing surface where, in use, the sample will contact the FET. Thus, the first layer effectively isolates the remainder of the FET from the liquid sample thereby reducing or eliminating errors e.g. caused by liquid disturbance. This also contributes to the reduction in issues with the use of FETs as transducers in sensing assemblies in real-world applications. In one embodiment, the channel layer is arranged on the FET base structure above the gate. That is, in one embodiment, the gate is provided beneath the channel. This provides a back-gated structure which is less prone to interference and noise. In particular, the gate dielectric is isolated from a sample solution, thus eliminating errors caused by the liquid disturbance.

In one embodiment, the first layer is provided over the drain and/or source. That is, the first layer is located between the (i) drain and/or source and (ii) the sensing surface (i.e. where the sample will be provided).

In one embodiment, providing the FET base structure comprises forming the FET base structure using a complementary metal-oxide-semiconductor (CMOS) fabrication process. For example, in one embodiment, providing the FET base structure comprises: providing the substrate, the substrate comprising a Si substrate; and providing the drain and source on the substrate. The provision of the drain, source and gate, where provided on the base structure, can be carried out using semiconductor fabrication methods.

In another embodiment, providing the FET base structure comprises forming the FET base structure using an additive manufacturing process. For example, in one embodiment, providing the FET base structure comprises: providing a polymeric substrate; and providing the drain and source on the substrate. The provision of the drain, source and gate, where provided on the base structure, can be carried out using additive manufacture to build up these components. Such methods are useful for building up low cost and easy to manufacture components. Moreover, this can be combined with techniques for printing layers, such as the first layer and channel.

Materials

The first layer and, where present, second layer comprise or are formed of (e.g. consist essentially of) one- and two-dimensional materials. These are materials having nano-scale (e.g. less than or equal to 1000 nm or less than or equal to 100 nm) dimensions, with the number of dimensions above this corresponding to the name. That is, one dimensional materials can be those with only one dimension greater than nanoscale (e.g. carbon nanotubes ("CNTs")). In the case of one-dimensional materials, these may be arranged to form the first layer, or may be provided as part of a first layer (e.g. in a matrix). Two dimensional materials have two dimensions greater than nanoscale (with one nanoscale dimension (e.g. monolayer or multilayer graphene or hexagonal-boron nitride). The first layer may comprise the two-dimensional materials or the first layer may be formed of (e.g. consist of) the two-dimensional material. A major face of the two-dimensional material may form the sensing surface. In some embodiments, the first layer comprises or is formed of one or two dimensional materials having a wider band gap than the channel.

In addition to graphene, other two-dimensional materials can include graphene-/graphite-like materials, such as materials having a two-dimensional planar structure sheet comprising atoms arranged in a (graphite-like or graphene-like) hexagonal formation. The materials can include graphene (e.g. graphene, functionalised graphene, graphene oxide), which is a two-dimensional allotrope of carbon with a single layer of graphene includes a single planar sheet of sp2-hybridized carbon atoms. In some embodiments, graphene is formed by providing graphene oxide and reducing the graphene oxide to form graphene. The materials may additionally or alternatively include, in embodiments, six membered rings with sp2-hybridized carbon atoms but may include other structures, including, in embodiments, six membered rings with atoms other than carbon. For example, this material may comprise at least one planar layer comprised of hexagonal six membered rings comprising (or consisting essentially of) carbon, boron, nitrogen and combinations thereof. In one embodiment, the material may comprise at least one planar layer comprised of hexagonal six membered rings comprising (or consisting essentially of) at least one heteroatom and may also comprise carbon. The provision of a heteroatom (e.g. a non-carbon, non-hydrogen) in the ring structure can be advantageous as the heteroatoms (e.g. N or B) can provide a site to bond further components to the surface (e.g. during functionlisation), enabling the further customisation of the FET. For example, this can act as a surface for self-assembled monolayers (SAM) on the active sensing surface. In some embodiments, the one-dimensional or two-dimensional material is selected from graphene, hexagonal boron-nitride, carbon nano-tubes, or a combination thereof.

The first layer may act as a capping or passivation layer on the FET. Accordingly, in some embodiments, the method further comprises patterning the first layer and/or the channel layer and removing at least a portion of the first layer and/or channel layer.

In one embodiment, the one-dimensional or two-dimensional material of the first layer and/or second layer is hexagonal boron nitride (hBN). This can include hBN in its pure form, doped hBN, functionalised hBN, oxidised hBN oxide or hBN combinations thereof.

hBN provides an advantageous material for use in or forming the first layer. hBN surfaces have the advantages of the first layer materials discussed above but additional are significantly easier to functionalise than most of the other materials. Moreover, hBN can be doped or modified to further optimise properties. The termination of the hBN surface (i.e. with N or B) can be used to further customise the properties and the ability to be functionalised. In some embodiments, hBN can act as a surface for self-assembled monolayers (SAM) on active sensing surface. hBN can also be deposited as a monolayer, or with only a few layers (e.g. 1-5, or 1-3 layers). This can provide a functional surface with little or no interference for the channel. This can accordingly act as a passivation layer. hBN, as with some other one- or two-dimensional materials has a wide-band gap (e.g. some CNTs) and can be used with lower band-gap channels to provide higher mobility and thus higher sensitivity within the channels. For example, when used in a GFET, it can lead to confinement in the graphene channel.

The use of hBN is particularly advantageous when used with a graphene-FET. The hBN has all of the properties listed above and provides a functional surface, some confinement of the channel and no (or little) interference with graphene surface. The hBN has been found to boost the mobility (up to 10×) of the graphene channel, which results in improved sensitivity and a higher overall performance. Moreover, when used in a GFET, it is significantly easier to functionalise as compared to the graphene used for the channel (due to the presence of the nitrogen and boron atoms). Therefore, in some embodiments, the method comprises providing a channel layer comprising or formed of graphene, and forming the first layer comprising or formed of hBN on the graphene. This may comprise chemical vapour deposition of precursors to hBN. The use of hBN avoids the need for defects or 3D growth starting areas, followed by flattening. hBN can be provided directly on a flat 2D surface. This in turn enables integration of this into more traditional CMOS fabrication methods. For example, this will allow an easier low cost monolithic integration of the sensing assemblies on the top of finished CMOS Si electronics wafers or plastic wafers, which would otherwise not have been possible. This is particularly true when the channel is graphene because of the very similar lattice structures and lack of dangling bonds on each surface.

In some embodiments, the first layer comprises $hBN_xO_{1-x}$, where $1>x\geq0$ or $1>x>0$. The method may therefore comprise provising oxidized hBN or oxidising hBN to form the first layer. This may improve functionality, as oxidized hBN can be useful in pH sensing assemblies as the presence of oxygen facilitates detection of $H^+$ ions.

The one or two-dimensional materials can include or be formed of at least 1 layer (e.g. one atomic layer) of said material and may be up to or equal to 15 layers (e.g. atomic layers) of said material, such as 1 to 5 or 1 to 3. The first layer can accordingly be 1 to 15 atomic layers thick. For example, the first layer may have a thickness of less than or equal to 1 nm, less than or equal to 5 nm, or less than or equal to 10 nm.

Where a second layer is present, the one-dimensional or two-dimensional material of the second layer can be any of the materials set out in respect of the first layer. For example, in some embodiments, the one-dimensional or two-dimensional material of the second layer is selected from graphene, hexagonal boron-nitride, carbon nano-tubes, or a combination thereof. In some embodiments, the second layer comprises hexagonal-boron nitride. Although the hBN can be doped, in some embodiments, the hBN of the second layer is undoped.

In some embodiments where the second layer is present, the first and second layers both comprise hexagonal-boron nitride. This can lead to advantageous constraining of charge carrier movement in the channel. In one embodiment, the channel layer comprises graphene, the first layer comprises hexagonal boron nitride and the second layer comprises hexagonal boron nitride.

As noted above, the FET base structure may further include a gate, which can comprise a gate electrode (e.g. as a gate electrode layer) and a gate dielectric. The gate electrode can be formed of polycrystalline silicon or a metal and may be doped. The gate dielectric is formed from a gate oxide or gate nitride, such as silicon dioxide.

The channel, drain, source and gate may all be formed of conventional materials. For example, the channel of the FET may be formed from Si, SiC, GaAs, GaN, InGaAs, or graphene.

In one embodiment, the channel is a graphene channel. The FET is accordingly a graphene-FET with a graphene channel.

Functionalisation

In one embodiment, the method further comprises modifying the first layer by at least one of functionalising the first layer or doping the first layer. This can be carried out prior to providing the first layer on the FET base structure or after the first channel is provided on the FET base structure. Where the first layer is formed on the channel layer, this can be prior to or after the forming of the first layer on the channel layer. The materials of the first layer can be easier to functionalisation than existing FET materials, particularly where heteroatoms or doping is present.

In one embodiment, the step of functionalising the first layer is carried out after the first channel is provided on the FET base structure. Functional surfaces can be prone to damage (e.g. from conditions involved in processing, including semiconductor fabrication techniques), especially where these are for biosensing or chemical sensing (e.g. capture species are provided on the first layer). Therefore, by carrying this out after the remainder of the FET has been manufactured, this can preserve the surface and maintain functionality and thus performance of the FET as a sensor.

Functionalisation may include functionalisation with a capture species. Such functionalization can be achieved in any suitable manner, such as by covalently or non-covalently immobilizing the interaction or capture species to the sensing surface (e.g. the upper surface of the first layer). Interaction or capture species are configured to selectively interact with an analyte. This can be achieved, for example, using an aptamer. Linker species can be used to connect the capture species to the surface.

In some embodiments, the method comprises doping the first layer (to form a doped first layer). For example, the one-dimensional or two-dimensional material may be doped to improve the ability of the surface to be functionalised. This may be with metal atoms. For example, gold-doped graphene. It has been found that gold can be used to covalently bond capture species to the sensing surface (e.g. to the graphene). This could be achieved using thiol-terminated capture specifies, such as DNA- or RNA-based aptamers or probes.

In one specific embodiment, the first layer comprises hexagonal-boron nitride doped with at least one of Si, Al, or Au. Doping with these elements provides an active group ready to be bonded (e.g. covalently bonded) to other entities, such as capture species (e.g. biomolecule receptors (e.g. cDNA), aptamers, etc.), and can further adjust the properties of the first layer (e.g. electronic properties). In some embodiments, the first layer comprises hexagonal-boron nitride doped with carbon. In one specific embodiment, the first layer may comprise $hBN_xO_{1-x}$:Si,Al,Au where $1>x\geq 0$ or $1>x>0$.

In one embodiment, the sensing surface (i.e. the first layer) is functionalized so as to be hydrophobic, such as via fluorination or silanization. That is, the first layer is modified by the attachment of fluorine and/or fluorine-containing and/or by the attachment of silane and/or silane-containing groups to the surface of the layer. This may be a coating. This incorporates the abovementioned groups on the surface and/or edges of the first layer and may be via covalent bonding, for example. Functionalisation in this way reduces the surface energy and thus creates a super-hydrophobic surface which reduces the risk of wetting or other surface effects affecting sensor readings. In some embodiments, the first layer as coated has a water contact angle of at least 120 degrees, for example 150 degrees. A water contact angle of at least 150 degrees is considered to be super- or ultra-hydrophobic. This can in some embodiments be measured by the contact angle measurement set out in "Study on the Surface Energy of Graphene by Contact Angle Measurements" Langmuir 2014, 30, 28, 8598-8606 Jul. 1, 2014, which is incorporated herein by reference. Alternatively, ASTM D5946-17, which is incorporated herein by reference, can be used.

In one embodiment, the channel layer may be functionalized. That is, the channel layer may be functionalized with particular moieties and/or a coating may be formed thereon.

In some embodiments, the first layer may not cover the entire surface of the channel layer and an exposed portion of the channel layer may be covered by a coating or functional moieties. This can enable further customization of the sensing surface, such as by removing portions of the first layer to provide discrete regions of the first layer and yet still provide the channel with a protective coating. In one particular embodiment, the first layer comprises or is hBN and the channel layer comprises graphene with a fluorinated coating provided on exposed portions of the channel (i.e. the surface of the channel layer has regions where there is no first layer and instead a fluorine-containing coating is provided thereon). In one embodiment, the method comprises providing the first layer on the channel and subsequently etching the first layer using an etchant comprising xenon difluoride. Xenon difluoride has been found to selectively etch the first layer (hBN) so as to remove this, but does not etch the graphene channel layer. Instead, a fluoride-containing coating is formed on the graphene.

Specific Embodiments

FIGS. 1A to 1D provide schematic cross-sectional drawings depicting components of a field effect transducer (FET) 100 during a process of manufacturing according to an embodiment. The FET 100 is shown in its form in FIG. 1D and includes a first layer 120 providing a sensing surface 120a, a channel 130, a drain 140, a drain pad 140a, a source 145, a source pad 145a, a dielectric layer 175 and a substrate 170.

The method of forming the FET 100 comprises providing a FET base structure 115, which is depicted in isolation in FIG. 1A. The FET base structure 115 comprises the substrate 170, on which is provided the drain 140 and source 145 separated by a dielectric layer 175. In embodiments, providing the FET base structure 115 can include forming the FET base structure 115 by the building up of each of the various components using a semiconductor processing method to form a monolith (e.g. an integrated body). In this way, the FET base structure 115 components can be manufactured using well-optimised techniques which are well-suited to mass production and miniaturisation.

The method further comprises providing a channel layer 130 on the FET base structure 115. The channel layer 130 forms a channel in the completed FET 100. In the method depicted in FIG. 1 B, the channel layer 130 is provided on the FET base structure 115 prior to the addition of the first layer 120. Depending on the materials used to form the channel, this may be formed directly on the FET base structure 115. For example, if the material(s) used to form the channel layer 130 are amenable to semiconductor processing methods, this may be formed in sequence with the formation of the ITT base structure 115. Alternatively, channel layer 120 can be formed separately and subsequently transferred onto the FET base layer 115, as discussed below in more detail.

The channel layer 130 in this embodiment is provided on the upper surface defined by the FET base structure 115, in contact with the source 145 and drain 140.

The method further comprises providing the first layer 120 on the FET base structure 115, as depicted in FIG. 1C. In this embodiment, the first layer 120 is provided on the FET base structure 115 after the channel layer 130 has been provided on thereon. The first layer 120 is provided on the upper surface of the channel 130 and forms the uppermost surface of the stack of layers. This will accordingly provide the sensing surface of the FET 100 when used as a sensor.

The first layer 120 comprises a one-dimensional or two-dimensional material. In this embodiment, the first layer 120 is formed of a planar layer of such a material extending parallel to the other layers.

Although not depicted, in the method at least one of (i) the step of providing the channel layer 130 comprises forming the channel layer 130 and subsequently transferring the channel layer 130 onto the FET base structure 115; or (i) the step of providing the first layer 120 on the FET base structure 115 comprises forming the first layer 120 and subsequently transferring the first layer 120 onto the FET base structure 115. Both may occur. Such processes are discussed in more detail below.

The method may further comprise additional processing steps. In the method represented by FIGS. 1A to 1D, the method further comprises patterning the channel layer 130 and first layer 120 and removing a portion of each of the respective layers. The method then comprises providing conductive elements (e.g. metal pads) in the form of a drain pad 140a and source pad 145a so as to electrically connect the drain 140 and source 145, respectively, to the upper surface of the FET 100.

Figure 2:
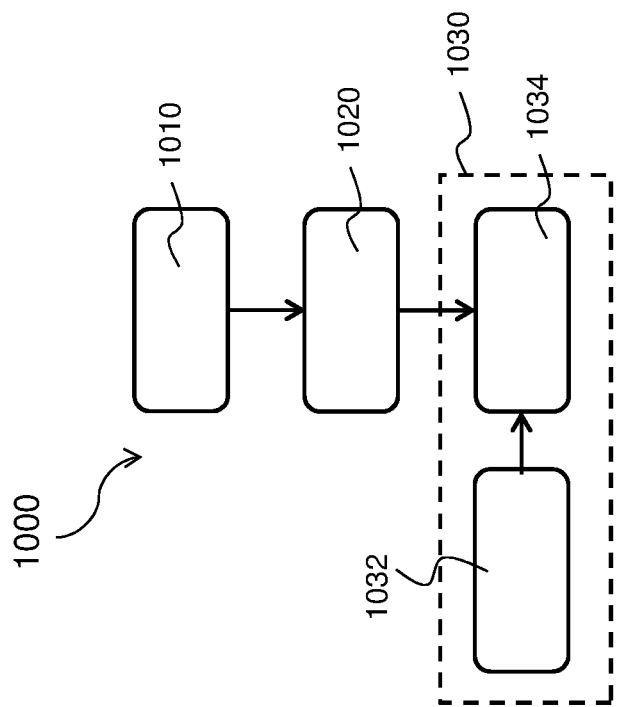
FIG. 2 provides a schematic depiction of a method according to an embodiment.

FIG. 2 schematically depicts a method of manufacturing a FET 1000 according to an embodiment of the invention. In this embodiment, the method 1000 comprises providing a FET base structure 1010, the FET base structure comprising a substrate, a drain and a source (at least). The method further comprises providing a channel layer on the FET base structure 1020. In this embodiment, the channel layer may be formed directly on the FET base structure so as to form and provide the channel layer on the FET base structure in a single step, or alternatively this can be formed separately and transferred to the FET base layer in a second step.

The method further comprises providing a first layer on the FET base structure 1030, which comprises two separate method steps: first, this comprises forming the first layer 1032. This comprises forming the first layer separately to and before it is provided on the FET base structure. The method then further comprises subsequently transferring the first layer onto the FET base structure 1034 so as to assemble the first layer and FET base structure (and channel layer). The first layer comprises a one-dimensional or two-dimensional material and is arranged on an upper surface of the channel layer so as to form a sensing surface of the FET.

FIG. 3 schematically depicts another method of manufacturing a FET 1100 according to an embodiment of the invention. This can be used together with or as an alternative to the method depicted in FIG. 2, for example. In this embodiment, the method 1100 comprises providing a FET base structure 1110, the FET base structure comprising a substrate, a drain and a source.

The method further comprises providing a channel layer on the FET base structure 1020. In this embodiment, this comprises two separate method steps: first, this comprises forming the channel layer 1122 separately to and before it is provided on the FET base structure. The method accordingly then further comprises transferring the channel layer onto the FET base structure 1122.

The method also comprises providing a first layer on the FET base structure 1030. In this embodiment, the first layer may be formed directly on the FET base structure (e.g. once the channel layer is provided thereon) so as to form and provide the first layer on the FET base structure in a single step, or alternatively this can be formed separately and transferred to the FET base layer in a second step.

An exemplary method of transferring layers is set out in respect of FIGS. 6A-6E, below.

Figure 4A:
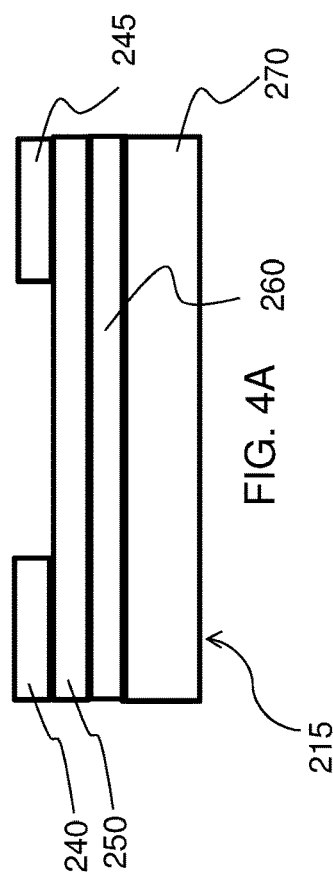
FIGS. 4A to 4C provides schematic cross-sectional views of the components during a method of manufacture according to an embodiment.
Figure 4B:
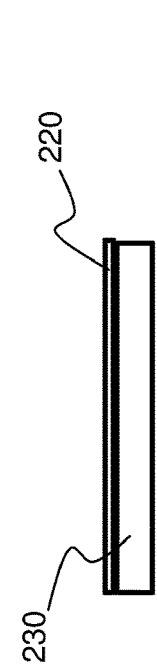
Figure 4C:
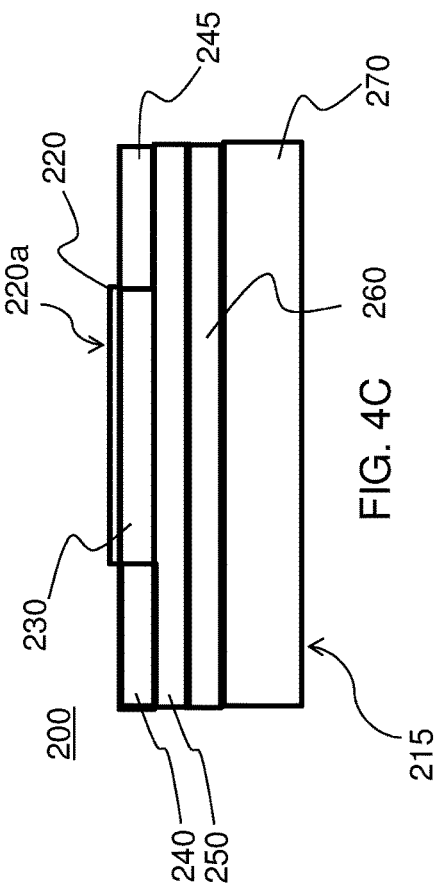

FIGS. 4A to 4C provide schematic cross-sectional drawings depicting components of a field effect transducer (FET) 200 during a process of manufacturing according to an embodiment. The FET 200 is shown in its final form in FIG. 4C and includes a first layer 220 providing a sensing surface 220a, a channel 230, a drain 240, a gate dielectric layer 250, a gate electrode layer 260 and a substrate 270.

Figure 5:
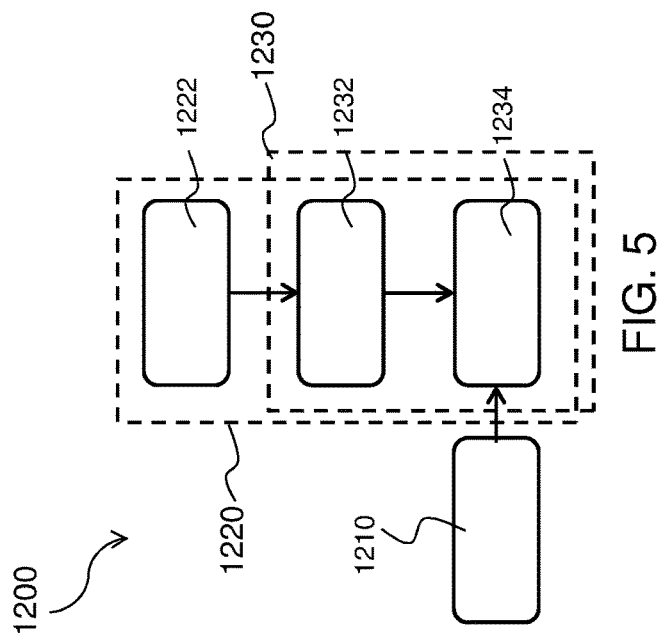
FIG. 5 provides a schematic depiction of a method according to an embodiment.

FIG. 5 schematically depicts the method of manufacturing which is used to provide the FET 200 shown in FIG. 4C and to provide the intermediate components in FIGS. 4A and 4B.

The method 1200 of forming the FET 200 comprises providing 1210 a FET base structure 215, which is depicted in isolation in FIG. 4A. The FET base structure 215 comprises the substrate 270, on which is provided the gate electrode layer 260. The gate electrode layer 260 is a metallic layer provided on the substrate 270. The gate oxide layer 250 is a dielectric layer formed on top of the gate electrode layer 260. These can be formed of conventional FET materials. The FET base structure 215 further comprises the drain 240 and source 245. The drain 240 is provided on one side of the FET base structure 215 and the source 245 on the opposite side. In this embodiment, a gap is provided between the source 245 and drain 240. These are formed of conventional FET source and drain materials.

As with the previous embodiments, this step of providing 1210 the FET base structure 215 can include forming the FET base structure 215 by the building up of each of the various components using a semiconductor processing method to form a monolith (e.g. an integrated circuit). This provides a complete unit to which the sensitive layers (i.e. the channel layer 230 and first layer 220) can then be provided. This is depicted in FIG. 4A.

The method further comprises providing 1220 a channel layer 230 on the FET base structure 215 and providing 1230 a first layer 220 on the FET base structure 215. In this embodiment, the channel layer 230 and first layer 220 are formed prior to assembly on the FET base structure 215.

In particular, in this embodiment, the method comprises forming 1222 the channel layer 230 prior to assembly on the FET base structure 215.

Subsequently, the first layer 220 is provided 1234 on the channel layer 230, prior to assembly on the FET base structure 215. This provides the structure shown in FIG. 4B with the channel layer 230 and first layer 220 as a single body. The provision 1234 of the first layer 220 on the channel layer 230 can comprise either forming the first layer 220 separately and then subsequently transferring it onto the channel layer 230 or may comprise forming the first layer 220 on the channel layer 230.

After the channel layer 230 and first layer 220 have been assembled, the method in this embodiment further comprises providing the layers 230, 220 as a unitary body onto the FET base structure 215. This comprises providing the unitary body on an upper surface of the FET base structure, which in this embodiment is the surface between the source 245 and drain 240 such that the channel layer 230 is electrically connected to the source 245 and drain 240. The layers are arranged so that the first layer 220 forms the uppermost surface of the FET 200, as shown in FIG. 4C.

In one specific embodiment of the method depicted in FIG. 5, the first layer 220 is formed of hBN and the channel layer 230 is formed of graphene. As such, the resultant FET 200 is a graphene-FET (GFET) with a hBN first layer 230 provided thereon.

The step of providing 1220 a channel layer 230 accordingly comprises forming a graphene channel. Formation of the channel layer 230 from graphene can be carried out, for example, using methods such as exfoliation. However, in one embodiment, this comprises forming the graphene using chemical vapour deposition (CVD) to form a graphene layer. This forms the channel layer 230.

As noted above, the step of providing 1230 the first layer can comprise either forming the first layer 220 separately and then subsequently transferring it onto the channel layer 230 or may comprise forming the first layer 220 on the channel layer 230. In this specific embodiment, it can be advantageous to form the first layer 220 on the channel layer 230. hBN can be grown on graphene surfaces without requiring defects to be formed and without needing to undergo flattening. Moreover, provision of the first layer 220 in this way ensures no contamination of the interfacing surfaces of the first layer 220 and the channel 230, which can increase sensitivity and reduces failure rates.

FIGS. 6A to 6E provide schematic cross-sectional drawings depicting components of a field effect transducer (FET) 300 during a process of manufacturing according to an embodiment. The method may be according to the method set depicted schematically in FIG. 5.

In particular, the FET 300 depicted in FIG. 6E and formed through the stages shown in FIG. 6A to 6D is formed by a method comprising providing the FET base structure 315 and forming the channel layer 330 and first layer 320 separately before assembly on the FET base structure 315.

The method in this embodiment starts with the formation of a channel layer 330 on a temporary substrate 335, as shown in FIG. 6A. Temporary substrate 335 can be selected for optimal deposition of the channel layer 330 materials. For example, this may be a substrate particularly suited for growth of the channel layer 330 (e.g. if using epitaxy e.g. CVD). Examples of suitable substrates include foils, such as copper foil.

The method then comprises providing the first layer 320 on the exposed major surface of the channel layer 320 while it remains on temporary substrate 335. This can comprise assembling a first layer 320 on the channel layer 320 or may comprise forming the first layer 320 directly on the channel layer 330. The latter can be advantageous where the materials are compatible. For example, where the channel layer 330 is a graphene layer, hBN can be grown on the upper surface to form the first layer 320 e.g. using CVD. The result is the assembly of the FET upper layers depicted in FIG. 6B.

The method subsequently comprises transferring the assembly of the FET upper layers (i.e. the first layer 320 and channel layer 330) onto a support 337, which acts as further temporary substrate or supporting body for transferring the layers. In this embodiment, support 337 is provided on the exposed upper surface of the channel layer 330 on the opposite side of the structure to the temporary substrate 335 (as depicted in FIG. 6C). The support 337, first layer 320 and channel layer 330 can then be removed from the temporary substrate 335.

This method can be advantageous for several reasons. First, this can transfer the layers to a more robust support more suited to transfer and protecting the layers than the original substrate 335 used for forming the channel layer (at least). This improves manufacturability and handling and can enable storage of the layers until an appropriate time. Second, as the support 337 in this embodiment is provided on the exposed side of the first layer 320 (or indeed whatever layer is exposed at the top in other embodiments), this can protect the pristine nature of this surface or reduce the risk of damage during further processing.

The method subsequently comprises transferring the assembly of the FET upper layers (i.e. the first layer 320 and channel layer 330) on support 337 onto the FET base structure 315. The FET base structure 315 comprises a substrate 370, on which is provided the gate electrode layer 360. The gate electrode layer 360 is a metallic layer provided on the substrate 370. The gate oxide layer 350 is a dielectric layer formed on top of the gate electrode layer 360. These can be formed of conventional FET materials. The FET base structure 315 further comprises the drain 340 and source 345. The drain 340 is provided on one side of the FET base structure 315 and the source 345 on the opposite side. These are formed of conventional FET source and drain materials.

FIG. 6D depicts the assembly of the FET upper layers (i.e. the first layer 320 and channel layer 330) on support 337 on the FET base structure 315. The layers are arranged so that the channel layer 330 is provided directly on top of FET base structure 315, with the first layer 320 above the channel layer 330. Support 337 is shown in situ in this figure. In some embodiments, support 337 can be used as a protective cap for the FET 300 until a later stage.

In this embodiment, the method then further comprises removal of the support 337 so as to leave a completed FET 300 shown in FIG. 6E. The removal process will depend on the particular substrate and materials used. Where the support 337 is a polymeric layer, wet and dry transfer methods can be used.

Although the embodiment of FIGS. 6A to 6E relates to the provision of a first layer 320 and channel layer 330 on the temporary substrate 335, in other embodiments, further layers may be provided on the temporary substrate 335 in a similar manner and subsequently transferred onto the FET base structure 315. For example, in embodiments comprising a second layer, the second layer may first be formed on the temporary substrate 335, followed by the provision (or forming) of the channel layer on the second layer, optionally also followed by the provision of the first layer thereon. Alternatively, the formation of the second layer may occur at a different point in the process. For example, after removal of the first layer 320 and channel layer 330 from the temporary substrate 335 and while these layers are provided on the support 337, a second layer can be provided to the exposed fact of the channel layer 330.

Figure 7:
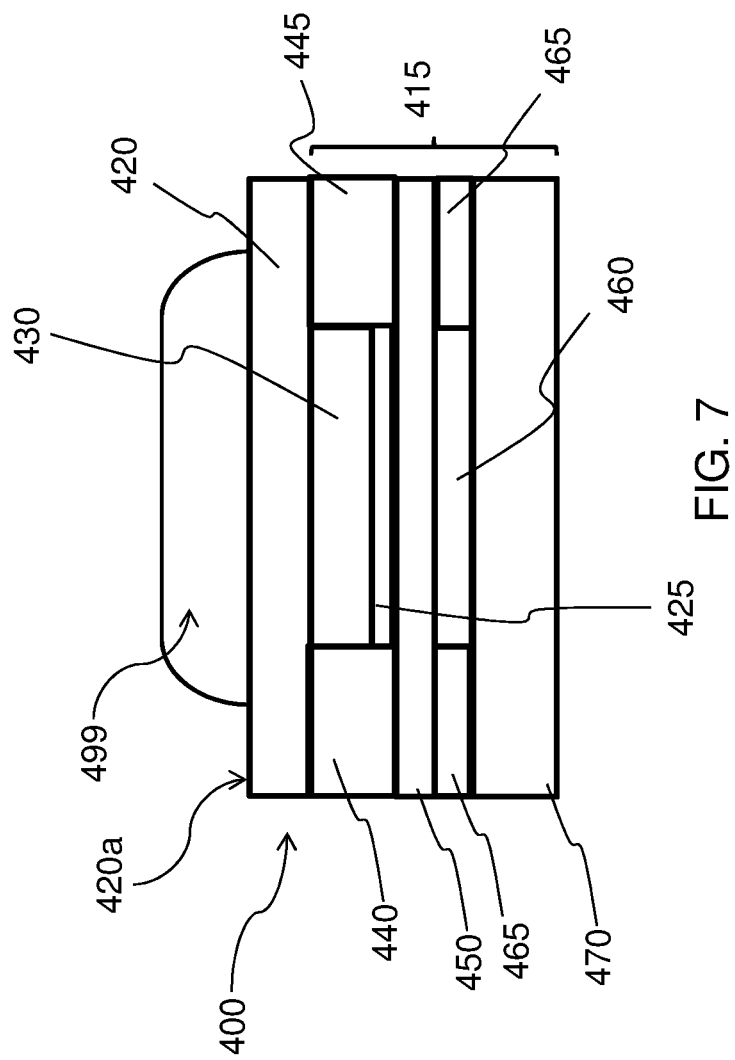
FIG. 7 provides a schematic cross-sectional of FET that can be manufactured according to a method according to an embodiment of the invention.

FIG. 7 provides a schematic cross-sectional view of a FET 400 which can be manufactured according to an embodiment. The FET 400 can be formed in the manner described with respect to the embodiment of FIGS. 6A-6E and includes a second layer 425 which is also formed on the temporary substrate 355 in the same manner as for the first layer and channel layer discussed in respect of the first embodiment. FET 400 can be used as a sensing assembly for detecting a property of (e.g. a parameter of or analyte in) a sample.

FET 400 comprises a first layer 420 providing a sensing surface 420a on which a liquid sample 499 can be provided. Beneath the first layer 420 is a channel layer 430 and beneath the channel layer is second layer 425. These layers 420, 430, 425 are provided on the FET base structure 415, which comprises a drain 440, a source 445, a gate oxide layer 450, additional gate oxide layer 465, a gate electrode layer 460 and a substrate 470. The source 445 and drain 340 are located beneath the first layer 420 and in plane with the channel 430 and second layer 425.

In this embodiment, the gate electrode layer 460 is a metallic layer provided on the substrate 470 with additional gate oxide layers 465, which are dielectric oxide layers, provided in a co-planar fashion surrounding the gate electrode layer 460. The gate oxide layer 450 is a dielectric layer formed on top of the gate electrode layer 460. These can be formed of conventional FET materials.

The drain 440 and source 345 are provided in the same plane as the channel 430, with the drain 440 on one side of the FET 400 and source 445 on the other side of the FET 400 on top of the gate oxide layer 450.

In the completed form, channel layer 430 extends between and connects source 445 and drain 440.

Once the first layer 420, channel 430 and second layer 425 are assembled on the FET base structure 415, second layer 425 is arranged on top of the gate oxide layer 450 and between source 445 and drain 440. In this embodiment, the channel 430 is provided on top of the second layer 425 and also extends between the source 445 and drain 440.

The first layer 420 is provided on top of the drain 440, channel 430 and source 445. The first layer 420 forms the outermost surface and thus forms the sensing surface 420a. The first layer 420 and second layer 425 accordingly enclose the channel 430 on either side. The first layer 420 and second layer 425 each comprise a one- or two-dimensional material. Enclosing the channel 430 in this way improves confinement within the channel 430 and improves the sensitivity to the channel 430 to changes on the sensing surface 420a, which in turn improves the performance of the sensing assembly. Moreover, enclosing the source 445 and drain 440 beneath the first layer 420 can further reduce the risk of interference from the sample 499.

In use, the sensing surface 420a forms the surface of the FET 400 which comes into contact with a liquid sample 499. It is therefore this sensing surface 420a and the first layer 420 where the interaction with the sample occurs and which in turn effects the electronic properties of the channel 430. The liquid sample 499 and top layer essentially act as a gate and cause a change in the channel 430 which can be measured. Any change or the magnitude of the change will depend on the sample 301 properties (e.g. presence of analyte, pH, etc.) and so the change can be used to infer the properties of the sample 499.

One implementation of the FETs of the present disclosure include pH sensors. In one embodiment and in the context of FIG. 7, the sensing assembly 400 can be used to determine the pH of a sample 499. In one particular embodiment, the first layer 420 comprises an oxidised one- or two-dimensional material (i.e. one containing oxygen, such as $hBN_xO_{x-1}$) or a doped one- or two-dimensional material such that the first layer is responsive to $H^+$ ions. In such an embodiment, a monolayer of the one- or two-dimensional material can be used as a passivation layer.

Another implementation of the sensing assemblies of the present disclosure include analyte sensors. In one embodiment and in the context of FIG. 7, the sensing assembly 400 can be used to detect an analyte in the sample 499 (i.e. determine the concentration of an analyte in the sample 499). This has particular benefits when used in chemical sensing or biosensing systems. This can be achieved by providing a capture species (not shown) on the first layer 430. For example, a capture species can be functionalised on the sensing surface 420a by bonding the capture species to the first layer 420, either directly or through a linker species. In some embodiments, the first layer 420 can be oxidised or doped to make functionalisation easier; however, for certain layers, such as those containing heteroatoms (e.g. hBN) this is not necessary as the heteroatoms can be used to form bonds (e.g. covalent bonds) with the capture species or a linker species.

In one specific embodiment of device of FIG. 7, the FET 400 is a graphene-FET and so the channel 430 is formed of a monolayer of graphene. As discussed above, graphene-FETs are useful as sensors but are susceptible to damage and interference caused by liquid samples. In this specific embodiment, the first layer 420 is formed from $hBN_xO_{1-x}$: Si,Al, and/or Au where $1>x>0$. That is, the first layer 420 oxides hBN layer that is also doped with at least one of Si, Al or Au. This is particularly advantageous as hBN can increase the mobility of the graphene channel increasing sensitivity, while still providing the benefits listed above. Moreover, hBN can be more easily deposited on graphene surfaces than other materials and is easier to functionalize than graphene. In this particular embodiment, the hBN layer 420 is a monolayer extending across the channel (i.e. parallel to the graphene channel) and thus can act as a passivation layer. In other embodiments, this can however be thicker (i.e. comprise more layers of hBN). Moreover, in this specific embodiment, the second layer 425 is formed of hBN. hBN has been found to act as an excellent wide-band gap layer and has a wider band-gap than graphene (a narrow band-gap material) and so the use of hBN on both sides of the channel 430 has been found to greatly improve the containment within the channel 430, thereby improving performance and surprisingly without impacting other properties of the FET 400.

It should be understood that the detailed description and specific examples, while indicating exemplary embodiments of the apparatus, systems and methods, are intended for purposes of illustration only and are not intended to limit the scope. These and other features, aspects, and advantages of the apparatus, systems and methods of the present invention can be better understood from the description, appended claims or aspects, and accompanying drawings. It should be understood that the Figures are merely schematic and are not drawn to scale. It should also be understood that the same reference numerals are used throughout the figures to indicate the same or similar parts.

Other variations to the disclosed embodiments can be understood and effected by those skilled in the art in practicing the disclosure, from a study of the drawings, the disclosure, and the appended aspects or claims. In the aspects or claims, the word "comprising" does not exclude other elements or steps, and the indefinite article "a" or "an" does not exclude a plurality. The mere fact that certain measures are recited in mutually different dependent aspects or claims does not indicate that a combination of these measures cannot be used to advantage. Any reference signs in the claims should not be construed as limiting the scope.

What is claimed is:

1. A method of manufacturing a field effect transducer (FET), the method comprising:
   providing a FET base structure comprising a substrate, a drain, and a source;
   providing a channel layer on the FET base structure, the channel layer being electrically connected to the drain and the source; and
   providing a first layer on the FET base structure,
   the first layer comprising a one-dimensional material or a two-dimensional material and overlaying a first surface of the channel layer, the drain, and the source so as to form a sensing surface of the FET, wherein the sensing surface is opposite the first surface;
   wherein
     providing the channel layer on the FET base structure and providing the first layer on the FET base structure comprise providing a single body onto the FET base structure, the single body being Formed prior to assembly on the FET base structure and having the channel layer and the first layer.

2. The method of claim 1, wherein providing the single body comprises forming the single body and subsequently transferring the single body onto the FET base structure.

3. The method of claim 2, wherein forming the single body and subsequently transferring the single body, onto the FET base structure comprise:
   forming the channel layer;
   subsequently providing the first layer on the channel layer; and
   subsequently transferring the channel layer and the first layer onto the PET base structure.

4. The method of claim 3, wherein subsequently providing the first layer on the channel layer comprises forming the first layer on the channel layer.

5. The method of claim 4, wherein the channel layer comprises grapheme and the first layer comprises hexagonal boron nitride (hBN), and wherein forming the first layer on the channel layer comprises forming hBN on a surface of the graphene.

6. The method of claim 3, wherein the single body further has a supporting body, and Wherein during the subsequently transferring the channel layer and the first layer onto the FET base structure, the channel layer and first layer are supported on the supporting body; and
   wherein the method further comprises separating the supporting body from the channel layer and first layer after the channel layer and first layer have been provided on the FET base structure.

7. The method of claim 6, wherein forming the channel layer comprises forming the channel layer on a temporary substrate and subsequently transferring the channel layer from the temporary substrate to the supporting body.

8. The method of claim 2, further comprising providing a second layer on the FET base structure, the second layer comprising a one-dimensional material or a two-dimensional material;
   wherein the second layer is arranged on a second surface of the channel layer, the second surface opposite the first surface.

9. The method of claim 8, wherein providing the second layer comprises forming the second layer and subsequently transferring the second layer onto the FET base structure.

10. The method of claim 9, wherein forming the single body and subsequently transferring the single body onto the FET base structure, and providing the second layer comprise:
    forming the channel layer;
    subsequently providing the second layer on the channel layer; and
    subsequently transferring the channel layer and the second layer onto the FET base structure.

11. The method of claim 10, wherein subsequently providing the second layer on the channel layer comprises forming the second layer on the channel layer.

12. The method of claim 9, wherein forming the single body and subsequently transferring the single body onto the PET base structure, and providing the second layer comprise:
    forming the channel layer;
    subsequently providing the first layer and the second layer on the channel layer; and
    subsequently transferring the channel layer, the first layer, and the second layer onto the FET base structure.

13. The method of claim 12, wherein providing the first layer and the second layer on the channel layer comprises forming the first layer and the second layer on the channel layer.

14. The method of claim 13, wherein the channel layer comprises graphene, the first layer comprises hexagonal boron nitride, and the second layer comprises hexagonal boron nitride.

15. The method of claim 1, wherein providing the FET base structure comprises forming the FET base structure using a complementary metal-oxide-semiconductor (CMOS) fabrication process.

16. The method of claim 1, wherein the FET base structure further comprises a gate comprising a gate electrode and a gate dielectric layer, and wherein the first layer is arranged on the FET base structure above the gate.

17. The method of claim 1, wherein providing the FET base structure comprises:
    providing the substrate, the substrate comprising a Si substrate; and
    providing the drain and source on the substrate.

18. The method of claim 1, wherein providing the FET base structure comprises:
    providing the substrate, the substrate comprising a polymeric substrate; and
    providing the drain and source on the substrate.

19. The method of claim 1, further comprising modifying the first layer by at least one of functionalising the first layer and doping the first layer, wherein modifying the first layer is carried out after the channel layer is provided on the FET base structure.

20. The method of claim 1, wherein the one-dimensional material or the two-dimensional material is selected from graphene, hexagonal boron-nitride, carbon nano-tubes, or a combination thereof.

* * * * *